(12) United States Patent
Chiang et al.

(10) Patent No.: US 8,283,734 B2
(45) Date of Patent: Oct. 9, 2012

(54) MULTI-THRESHOLD VOLTAGE DEVICE AND METHOD OF MAKING SAME

(75) Inventors: Chung-Yu Chiang, Yuanlin Township, Changhua County (TW); Da-Wen Lin, Hsinchu (TW); Shyh-Wei Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 261 days.

(21) Appl. No.: 12/757,465

(22) Filed: Apr. 9, 2010

(65) Prior Publication Data

US 2011/0248351 A1   Oct. 13, 2011

(51) Int. Cl.
*H01L 27/092* (2006.01)
*H01L 21/8238* (2006.01)

(52) U.S. Cl. . 257/407; 257/369; 257/408; 257/E27.062; 257/E21.632; 438/154; 438/199

(58) Field of Classification Search .................. 257/369, 257/407, 408, E27.062, E21.632; 438/154, 438/199

See application file for complete search history.

(56) References Cited

U.S. PATENT DOCUMENTS

| | | | |
|---|---|---|---|
| 4,714,519 A | 12/1987 | Pfiester | |
| 6,833,596 B2 * | 12/2004 | Matsuo | 257/412 |
| 7,344,934 B2 * | 3/2008 | Li | 438/199 |
| 2003/0151098 A1 * | 8/2003 | Nishida et al. | 257/369 |
| 2005/0148131 A1 * | 7/2005 | Brask | 438/199 |
| 2009/0189224 A1 * | 7/2009 | Matsumoto | 257/369 |
| 2009/0250766 A1 * | 10/2009 | Dix | 257/392 |
| 2010/0219484 A1 * | 9/2010 | Li | 257/369 |

* cited by examiner

*Primary Examiner* — Victor A Mandala
(74) *Attorney, Agent, or Firm* — Haynes and Boone, LLP

(57) ABSTRACT

An integrated circuit device and method for manufacturing the integrated circuit device are disclosed. An exemplary method includes providing a substrate; forming a first gate over the substrate for a first device having a first threshold voltage characteristic, the first gate including a first material having a first-type work function; forming a second gate over the substrate for a second device having a second threshold voltage characteristic that is greater than the first threshold voltage characteristic, the second gate including a second material having a second-type work function that is opposite the first-type work function; and configuring the first device and the second device as a same channel type device.

20 Claims, 5 Drawing Sheets

MULTI-THRESHOLD VOLTAGE DEVICE AND METHOD OF MAKING SAME

BACKGROUND

Multi-threshold voltage IC devices are often utilized in the semiconductor integrated circuit (IC) industry to optimize delay or power. A multi-threshold voltage IC device may include several different devices, each having a different threshold voltage (i.e., operating voltage). For example, the multi-threshold voltage IC device may include a low threshold voltage device and a high threshold voltage device. One approach to achieving the different threshold voltage devices includes channel and halo implantation optimization. This implements heavy implantations to achieve the higher threshold voltage devices, and separate masks for each desired threshold voltage. It has been observed that the heavier implantation processes can cause mobility degradation and junction leakage current, and using a separate mask for each desired threshold voltage incurs unnecessary cost. Another approach, which has been used in conjunction with the channel/halo implantation optimization, includes enlarging a channel length of the higher threshold voltage devices. However, as technology nodes continue to decrease, functional density (i.e., the number of interconnected devices per chip area) has generally increased while geometry size (i.e., the smallest component (or line) that can be created using a fabrication process) has decreased. Enlarging channel lengths to accommodate higher threshold voltage devices thus consumes valuable IC device space, limiting the amount of devices that can be fabricated on a single chip. Accordingly, although existing approaches for fabricating multi-threshold voltage devices have been generally adequate for their intended purposes, they have not been entirely satisfactory in all respects.

SUMMARY

The present disclosure provides for many different embodiments. One of the broader forms of an embodiment of the present invention involves a method that includes providing a substrate; forming a first gate over the substrate for a first device having a first threshold voltage characteristic, the first gate including a first material having a first-type work function; forming a second gate over the substrate for a second device having a second threshold voltage characteristic that is greater than the first threshold voltage characteristic, the second gate including a second material having a second-type work function that is opposite the first-type work function; and configuring the first device and the second device as a same channel type device.

Another one of the broader forms of an embodiment of the present invention involves a method for fabricating an integrated circuit device. The method includes: providing a substrate; forming a first transistor having a first channel of a first conductivity type disposed in the substrate, the first transistor being operable at a first voltage; forming a second transistor having a second channel of a second conductivity type disposed in the substrate, the second conductivity type being the same as the first conductivity type, and the second transistor being operable at a second voltage; and selecting a first gate electrode material for the first transistor and selecting a second gate electrode material for the second transistor, such that the second voltage is different than the first voltage. providing a substrate; forming a first transistor having an n-channel and a first gate including an n-type work function material, the first transistor being operable at a first voltage; forming a second transistor having an n-channel and a second gate including a p-type work function material, the second transistor being operable at a second voltage, the second voltage being higher than the first voltage; forming a third transistor having a p-channel and a third gate including a p-type work function material, the third transistor being operable at a third voltage; and forming a fourth transistor having a p-channel and a fourth gate including an n-type work function material, the fourth transistor being operable at a fourth voltage, the fourth voltage being higher than the third voltage. The method further includes performing a first implantation process to form source/drain regions for the first and second transistors; and performing a second implantation process to form source/drain regions for the third and fourth transistors.

Yet another one of the broader forms of an embodiment of the present invention includes an apparatus that includes: a substrate having a first region and a second region; a first field effect transistor (FET) disposed in the first region of the substrate, the first FET being operable at a first voltage; and a second FET disposed in the second region of the substrate, the second FET being operable at a second voltage greater than the first voltage. The first FET includes a gate electrode of a first-type work function material, and the second FET includes another gate electrode of a second-type work function material that is opposite the first-type work function material. The first FET is of a same channel type as the second FET.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
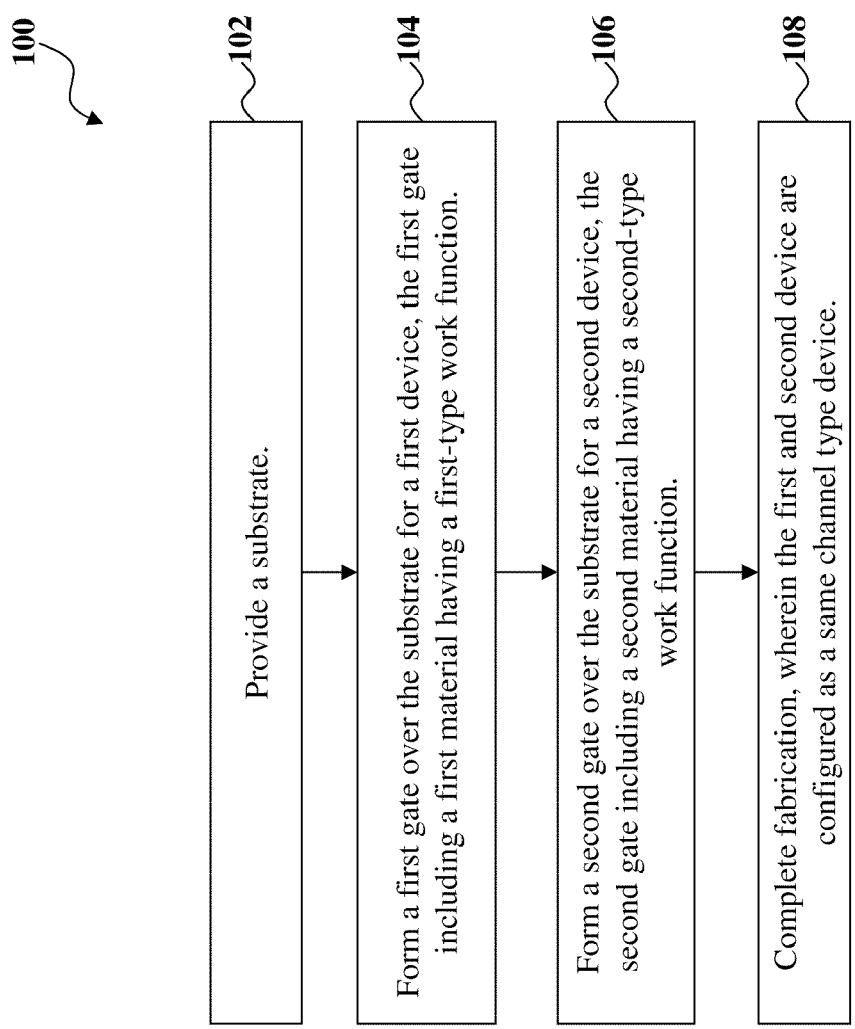
FIG. 1 is a flow chart of a method for fabricating an integrated circuit device according to various aspects of the present disclosure.

The present disclosure relates generally to integrated circuit devices and methods for manufacturing integrated circuit devices, and more particularly, to multi-threshold voltage integrated circuit devices and methods for manufacturing the same.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed between the first and second features, such that the first and second features may not be in direct contact.

FIG. 1 is a flow chart of a method 100 for fabricating an integrated circuit device. The method 100 begins at block 102 where a substrate is provided. At blocks 104 and 106, a first gate for a first device and a second gate for a second device are formed over the substrate. The first gate includes a first material having a first-type work function, and the second gate includes a second material having a second-type work function. The method 100 continues at block 108 where fabrication of the integrated circuit device is completed. This includes configuring the first device and the second device to have a same channel type. Additional steps can be provided before, during, and after the method 100, and some of the steps described can be replaced or eliminated for additional embodiments of the method. Further, the method 100 for fabricating the integrated circuit device can include a CMOS process flow, and thus, some processes may be only briefly described herein. The discussion that follows illustrates various embodiments of an integrated circuit device that can be fabricated according to the method 100 of FIG. 1.

Figure 2:
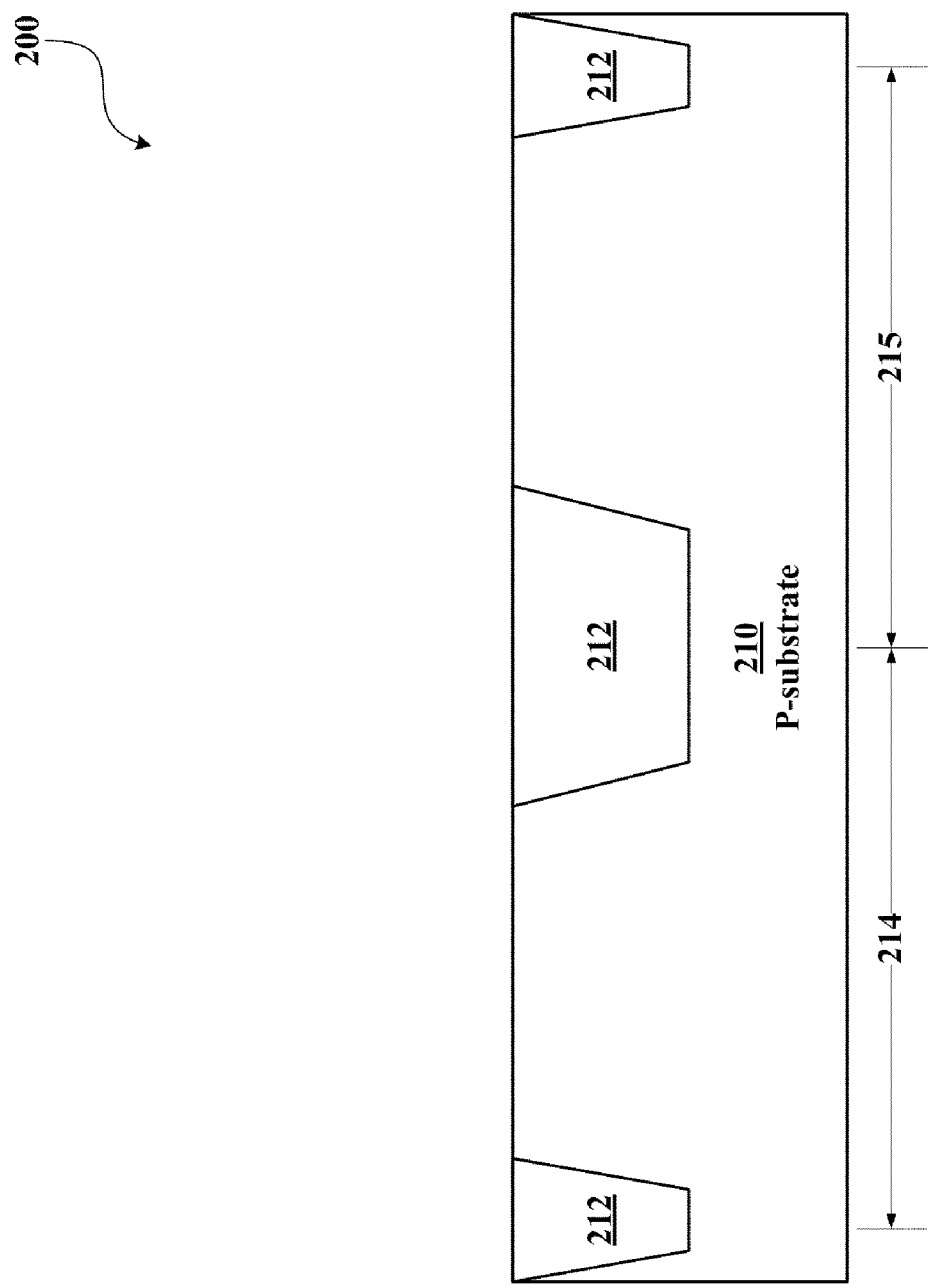
FIGS. 2-4 are diagrammatic cross-sectional side views of an integrated circuit device during various fabrication stages according to the method of FIG. 1.
Figure 3:
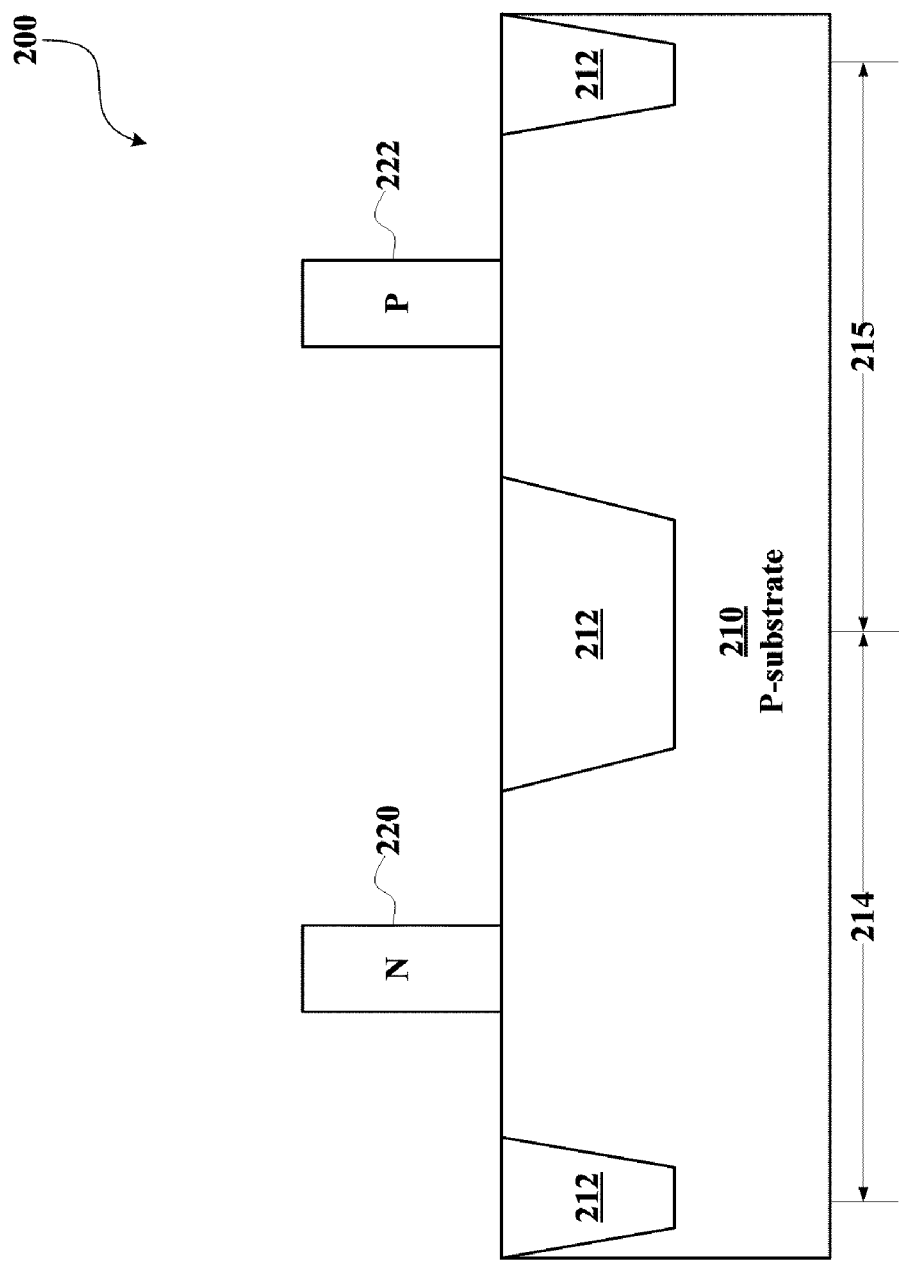
Figure 4:
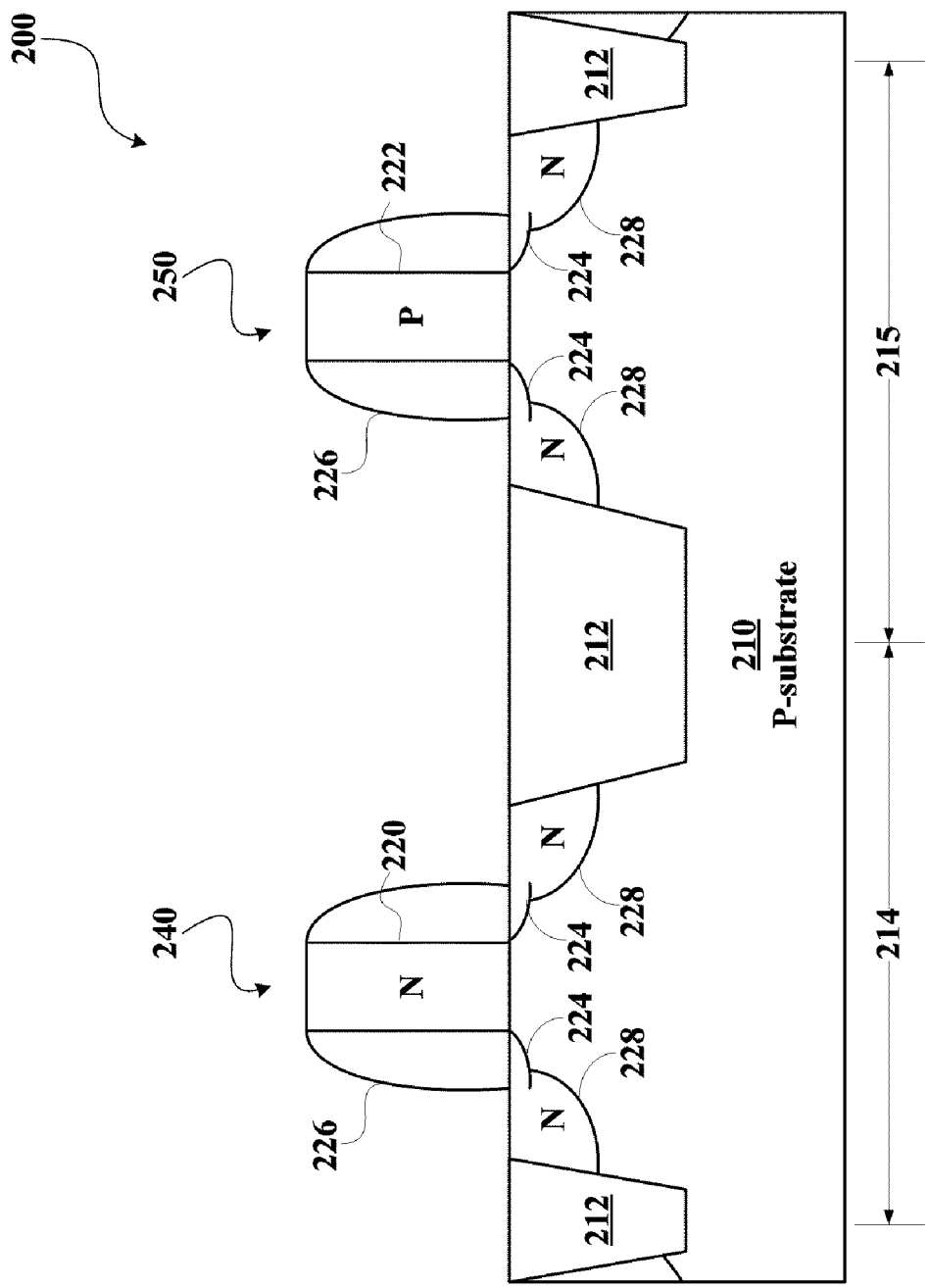

FIGS. 2-4 are diagrammatic cross-sectional side views of an integrated circuit device 200 at various stages of fabrication according to the method of FIG. 1. FIGS. 2-4 have been simplified for the sake of clarity to better understand the inventive concepts of the present disclosure. The integrated circuit device 200 is a multi-threshold voltage device. For example, as will be described in further detail below, in the present embodiment, the integrated circuit device 200 includes a standard threshold voltage device (FIG. 4, device 240) and a high threshold voltage device (FIG. 4, device 250). The standard and high voltage devices are field effect transistors (FETs). In the present embodiment, the FETs are configured as n-channel FETs (NFETs), and thus, the metal types and/or doping configurations described herein with reference to integrated circuit device 200 will be such to achieve the NFETs. Alternatively, the FETs are configured as p-channel FETs (PFETs), and the metal types and/or doping configurations could be adjusted to achieve the PFETs in the integrated circuit device 200. In yet another alternative, the integrated circuit device 200 could include NFETs and PFETs. The integrated circuit device 200 can further include memory cells and/or logic circuits, passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors; other suitable components; and/or combinations thereof. Additional features can be added in the integrated circuit device 200, and some of the features described below can be replaced or eliminated for additional embodiments of the integrated circuit device 200.

In FIG. 2, a substrate 210 is provided. In the present embodiment, the substrate 210 is a p-type semiconductor substrate (P-Substrate) comprising silicon. Alternatively, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer. The substrate 210 may include doped regions, such as a p-well, an n-well, or combination thereof.

Isolation feature 212 is formed in the substrate 210 to isolate various regions, such as first region 214 and second region 215, of the substrate 210. The isolation feature 212 also isolates the first and second device regions 214 and 215 from other devices (not shown). The isolation feature 212 utilizes isolation technology, such as local oxidation of silicon (LOCOS) and/or shallow trench isolation (STI), to define and electrically isolate the various regions. The isolation feature 212 comprise silicon oxide, silicon nitride, silicon oxynitride, other suitable materials, or combinations thereof. The isolation feature 212 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

As noted above, the integrated circuit device 200 is a multi-threshold voltage device. Accordingly, the first region 214 and second region 215 include devices that have different threshold voltage characteristics. For example, the first region 214 includes a device having a lower (or higher) threshold voltage characteristic than a device included in the second region 215. Accordingly, the devices in the first and second regions 214 and 215 operate at different voltages. In the present embodiment, the first region 214 is a standard threshold voltage device region, where the standard threshold voltage device (FIG. 4, device 240) will be formed, and the second region 215 is a high threshold voltage device region, where the high threshold voltage device (FIG. 4, device 250) will be formed. The device in the first region 214 will then operate at a lower voltage than the device in the second region. Other threshold voltage devices are contemplated, and the integrated circuit device 200 is not limited by the standard and high voltage threshold devices illustrated and described in the present embodiment. In furtherance of the present embodiment, the standard and high voltage threshold devices are configured as devices with a same channel type. For example, the standard and high voltage threshold devices in the first and second device regions 214 and 215 are the NFET devices mentioned above. Accordingly, features of the standard and high threshold voltage devices (FIG. 4, devices 240 and 250) in the first and second regions 214 and 215 will be configured such that NFET devices are formed. Alternatively, the devices in the first and second device regions 214 and 215 are PFET devices, and thus, the features described below could be configured so that PFET devices are formed.

Current methods for fabricating devices having different threshold voltage characteristics utilize channel and halo implantation optimization alone or in combination with enlarging a channel (or gate) length of the devices. For example, a high threshold voltage device is achieved by heavily implanting the device's channel/halo pockets and enlarging its gate length, and therefore channel length. The heavier implantation processes can cause junction leakage and/or mobility degradation As device technology nodes are continually scaled down, enlarging the device's gate/channel length consumes valuable device area. Further, the current methods are costly, which can arise from using a separate mask for the channel/halo implantations of each device having a different threshold voltage characteristic.

Referring to FIG. 3, in the present embodiment, the method 100 implements gate materials with different work function types to achieve the different threshold voltage characteristics for each device in regions 214 and 215. The integrated circuit device 200 includes a gate structure formed over the substrate 210 in the first and second device regions 214 and 215. In the present embodiment, the gate structure includes a gate stack 220 in standard threshold voltage device region 214, and the gate structure includes a gate stack 222 in the high threshold voltage device region 215. The gate stacks 220 and 222 include a work function layer. As noted, in the present embodiment, the gate stacks 220 and 222 include work function layers with different work function types. The work function layers include an n-type work function material or a p-type work function material. The n-type work function material includes Ti, Ag, Al, TiAlN, TaC, TaCN, TaSiN, Mn, Zr, other suitable n-type work function materials, or combinations thereof. The p-type work function material includes TiN, TaN, Ru, Mo, Al, WN, other suitable p-type work function materials, or combinations thereof. A work function value is associated with the material composition of the work function layer, and thus, the work function layer of each gate stack 220 and 222 is chosen to tune its work function value so that a desired threshold voltage Vt is achieved in each device region 214 and 215. For example, in the present embodiment, gate stack 220 comprises an n-type work function material (N) that is selected to achieve a standard threshold voltage for the NFET device, and gate stack 222 comprises a p-type work function material (P) that is selected to achieve a high threshold voltage for the NFET device. Where the standard and high threshold voltage devices are PFET devices, the gate stack 220 comprises a p-type work function material, and the gate stack 222 comprises a n-type work function material.

Using the different work function type materials for achieving different threshold voltage characteristics for the devices provides several advantages, it being understood that different embodiments can offer different advantages and that no particular advantage is required for any one embodiment. For example, a higher threshold voltage device can be achieved without enlarging the gate/channel length of the higher threshold voltage device. This saves device area, such that as technology nodes continue to decrease, more devices can be fabricated in a smaller area and still achieve the various threshold voltage characteristics. Also, fewer and lighter implantation processes are necessary in the present embodiment, as opposed to the heavier implantation processes required to modify threshold voltage characteristics in current methods. This leads to higher mobility and less junction leakage, which can improve overall device performance. This also leads to the use of fewer masks in the fabrication of the integrated circuit device. The present embodiment thus incurs no extra fabrication costs.

The gate stacks can include other material layers, such as interfacial layers, gate dielectric layers, high-k gate dielectric layers, capping layers, fill conductive layers, adhesion layers, barrier layers, wetting layers, other suitable layers, and/or combinations thereof. The work function and other material layers of the gate stacks 220 and 222 are formed by deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, or ion-beam writing. The etching processes include dry etching, wet etching, and/or other etching methods.

Referring to FIG. 4, the fabrication of the devices 240 and 250 in first and second regions 214 and 215 of the integrated circuit device 200 is completed. This may include forming lightly doped source/drain (LDD) regions 224. The LDD regions 224 may include halo/pocket implantations. The LDD regions 224 are formed in the substrate 210 by ion implantation processes, photolithography processes, diffusion processes, annealing processes (e.g., rapid thermal annealing and/or laser annealing processes), and/or other suitable processes. The implantation process could include a tilt-angle ion implantation, such as a large-angle tilted halo/pocket implantation, which can reduce short channel effects (e.g., punch-through effects). The doping species depends on the type of device being fabricated and includes p-type dopants, such as boron or $BF_2$; n-type dopants, such as phosphorus or arsenic; and/or combinations thereof. In the present embodiment, the device regions 214 and 215 are configured for NFET devices, and so, the LDD regions 224 include n-type (N) dopants.

As noted above, conventional processing utilizes the LDD/halo/pocket implantation to tune the threshold voltage device characteristics of each device. Thus, for each device having a different operating voltage (threshold voltage characteristic), a separate implantation process is required, and accordingly, a separate mask is required for the implantation. For example, if four different threshold voltage devices are desired in the integrated circuit device, four separate implantation processes are performed, using four different masks. In contrast, since the method 100 implements gate materials with different work function types to achieve the different threshold voltage characteristics for each device, fewer implantation processes and fewer masks are necessary. Instead of requiring n mask layers for n different threshold voltage devices, the method 100 may necessitate n−1 or even n/2 masks and implantations to achieve the same n different threshold voltage devices. For example, in the present embodiment, a single mask can be used to implant the LDD regions 224.

Gate spacers 226 may be formed, such that the spacers 226 are positioned adjacent the gate stacks 220 and 222. The gate spacers 226 can be considered a portion of the gate structures in the first and second regions 214 and 215. The gate spacers 226 include a dielectric material, such as silicon nitride, silicon nitride, silicon oxynitride, other suitable material, and/or combination thereof. The gate spacers 226 can be used to offset subsequently formed doped regions, such as HDD regions 228.

HDD regions 228 may also be formed in the substrate 210 by ion implantation processes, photolithography processes, diffusion processes, annealing processes (e.g., rapid thermal annealing and/or laser annealing processes), and/or other suitable processes. The doping species depends on the type of device being fabricated and includes p-type dopants, such as boron or $BF_2$; n-type dopants, such as phosphorus or arsenic; and/or combinations thereof. In the present embodiment, the device regions 214 and 215 are configured for NFET devices, and so, the HDD regions 228 include n-type (N) dopants. Additionally, the HDD regions 228 could include raised S/D regions. The raised S/D regions can be formed by an epitaxy process, such as a CVD deposition techniques (e.g., vapor-phase epitaxy (VPE) and/or ultra-high vacuum CVD (UHV-CVD)), molecular beam epitaxy, and/or other suitable processes.

The integrated circuit device 200 may undergo further CMOS or MOS technology processing to form various features known in the art. For example, one or more contact features (not shown), such as silicide regions, may also be formed. The contact features may be coupled to the source and drain regions 224 and 228. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

An ILD layer may be formed over the substrate. The ILD layer comprises a dielectric material, such as silicon oxide, silicon nitride, silicon oxynitride, TEOS formed oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer can include a multilayer structure having multiple dielectric materials.

Subsequent processing may further include forming various contacts/vias/lines and multilayer interconnect features (e.g., metal layers and interlayer dielectrics) over the substrate 210, configured to connect the various features or structures of the integrated circuit device 200. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

Figure 5:
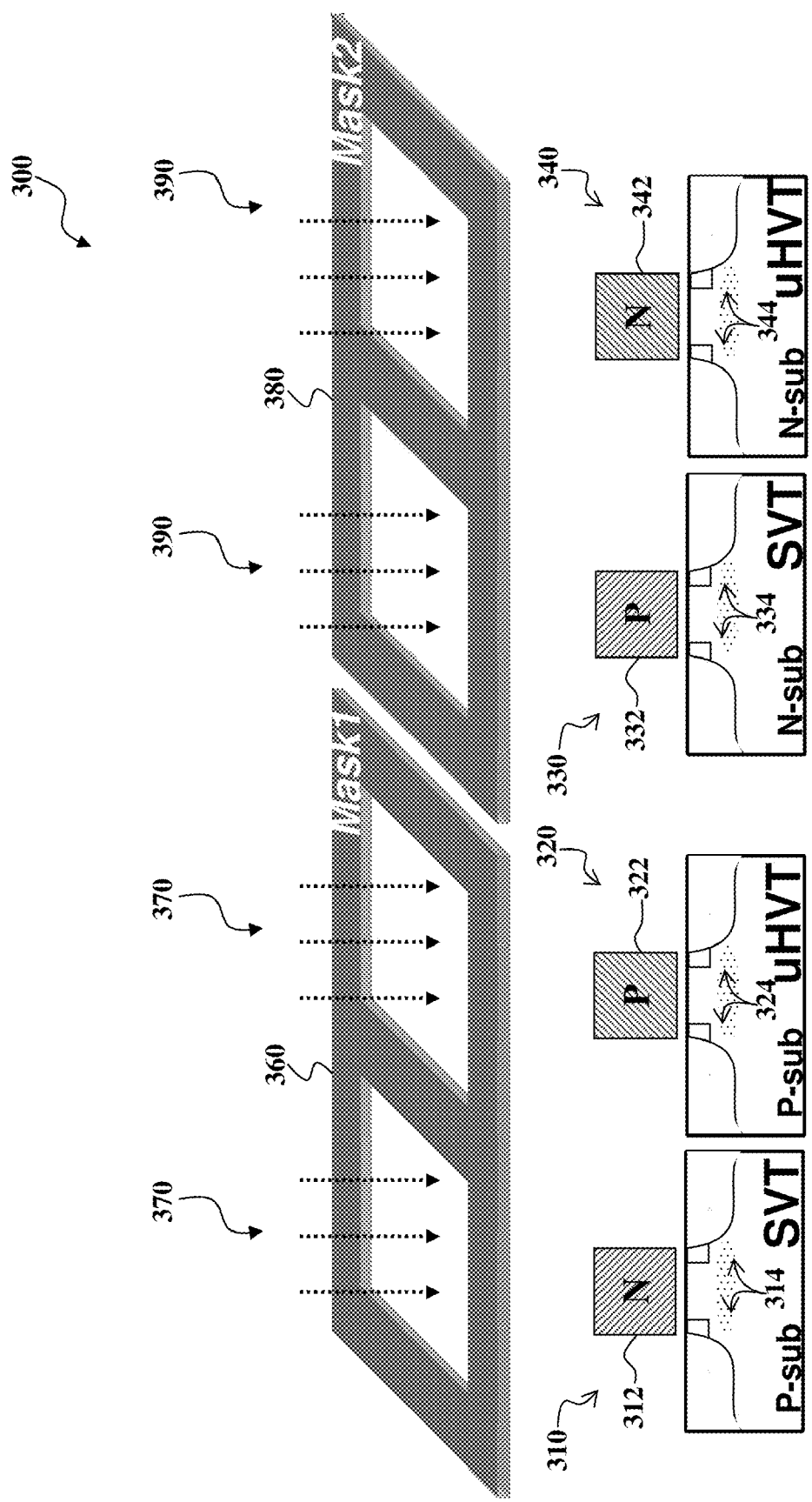
FIG. 5 is a diagrammatic cross-sectional side view of an integrated circuit device having different channel-type devices according to various aspects of the present disclosure.

FIG. 5 illustrates a diagrammatic cross-sectional side view of an integrated circuit device 300 undergoing implantation processes to form n-channel and p-channel devices. The integrated circuit device 300 is similar in some respects to integrated circuit device 200, and thus features of the integrated circuit device 300 will not be described in detail herein. The integrated circuit device 300 includes a standard threshold voltage (SVT) device 310 including a gate stack 312 and source/drain regions 314; an ultra-high threshold voltage (uHVT) device 320 including a gate stack 322 and source/drain regions 324; a standard threshold voltage (SVT) device 330 including a gate stack 332 and source/drain regions 334; and an ultra-high threshold voltage (uHVT) device 340 including a gate stack 342 and source/drain regions 344.

The SVT and uHVT devices 310 and 320 are configured as NFETs, and the SVT and uHVT devices 330 and 340 are configured as PFETs. Accordingly, the substrate can be a p-type substrate (P-sub) for the NFET devices 310 and 320, and an n-type substrate (N-sub) for the PFET devices 330 and 340. This can be achieved by forming doped regions in the substrate/wafer, such that the substrate/wafer includes p-doped regions where the NFET devices are formed and n-doped regions where the PFET devices are formed. The gate stack 312 of the SVT NFET device 310 includes an n-type work function material, and the gate stack 322 of the uHVT NFET device 320 includes a p-type work function material. The gate stack 332 of the SVT PFET device 330 includes a p-type work function material, and the gate stack 342 of the uHVT PFET device 340 includes an n-type work function material. The gate stacks 312 and 342 can be independently or simultaneously formed, and the gate stacks 322 and 332 can be independently or simultaneously formed. In accordance with the present disclosure, the different type work function materials of the gate stacks 312 and 322 of the NFET devices 310 and 320, respectively, achieve different voltage threshold characteristics for the NFET devices 310 and 320. Similarly, the gate stacks 332 and 342 of PFET devices 330 and 340, respectively, achieve different threshold voltage characteristics for the PFET devices. For example, in the present embodiment, the SVT NFET device 310 has a lower operating voltage than the uHVT NFET device 320, and the SVT PFET device 330 has a lower operating voltage than the uHVT PFET device 340.

Further, as shown in FIG. 5, the implantation processes that form the source/drain regions of the devices 310, 320, 330, and 340 can use fewer masks than conventional processing. For example, typically, four separate implantation processes form source/drain regions for the devices 310, 320, 330, and 340—an implantation process (and mask) for forming source/drain regions for SVT NFET device 310, an implantation process (and mask) for forming source/drain regions for uHVT NFET device 320, an implantation process (and mask) for forming source/drain regions for SVT PFET device 330, and an implantation process (and mask) for forming source/drain regions for the uHVT PFET device 340. In the present embodiment, a mask 360 is utilized for an implantation process 370 to form source/drain regions 314 for SVT NFET device 310 and source/drain regions 324 for uHVT device 320, and another mask 380 is utilized for an implantation process 390 to form source/drain regions 334 for SVT PFET device 330 and source/drain regions 344 for uHVT PFET device 340. The doping species for the implantation processes 370 and 390 depends on the type of device being fabricated and includes p-type dopants, such as boron or $BF_2$; n-type dopants, such as phosphorus or arsenic; and/or combinations thereof. In the present embodiment, as noted, devices 310 and 320 are configured as NFET devices, and so, the source/drain regions 314 and 324 are implanted with n-type (N) dopants; and devices 330 and 340 are configured as PFET devices, and so, the source/drain regions 334 and 344 are implanted with p-type (P) dopants.

The present disclosure provides a multi-threshold voltage device and method for fabricating a multi-threshold voltage device that can provide improved device reliability and performance. As noted, the present disclosure achieves different advantages in various embodiments disclosed herein, and it is understood that different embodiments disclosed herein offer several different advantages, and that no particular advantage is necessarily required for all embodiments. For example, the present disclosed method provides a simple and cost-effective method for achieving different threshold voltage devices on an integrated circuit device chip. The different threshold voltage devices can be achieved by using different work function type materials. Thus, using heavier implantations to optimize device channels and enlarging channel lengths may be avoided. This becomes increasingly important with smaller features in advanced technology nodes such as 45 nm, 32 nm, 22 nm, and beyond.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate;
   forming a first gate over the substrate for a first device having a first threshold voltage characteristic, the first gate including a first metal material having a first-type work function;
   forming a second gate over the substrate for a second device having a second threshold voltage characteristic that is greater than the first threshold voltage characteristic, the second gate including a second metal material having a second-type work function that is opposite the first-type work function; and
   configuring the first device and the second device as a same channel type device.

2. The method of claim 1 wherein the configuring the first and second devices as the same channel type devices comprises configuring the first and second devices as n-channel field effect transistors, wherein the first-type work function is an n-type work function, and further wherein the second-type work function is a p-type work function.

3. The method of claim 1 wherein the configuring the first and second devices as the same channel type devices comprises configuring the first and second devices as p-channel field effect transistors, wherein the first-type work function is a p-type work function, and further wherein the second-type work function is an n-type work function.

4. The method of claim 1 wherein:
   the forming the first gate for the first device having the first threshold voltage characteristic comprises selecting the first metal material of the first gate such that the first device operates at a first voltage; and
   the forming the second gate for the second device having the second threshold voltage characteristic comprises selecting the second metal material of the second gate such that the second device operates at a second voltage, the second voltage being greater than the first voltage.

5. The method of claim 1 further comprising:
   forming first lightly doped source/drain (LDD) regions in the substrate, such that the first gate is disposed between the first LDD regions; and
   forming second LDD regions in the substrate in the substrate, such that the second gate is disposed between the second LDD regions.

6. The method of claim 5 wherein the forming the first and second LDD regions comprises performing an ion implantation process using a single mask.

7. The method of claim 5 further comprising:
   forming first heavily doped source/drain (HDD) regions in the substrate, such that the first gate is disposed between the first HDD regions; and
   forming second HDD regions in the substrate in the substrate, such that the second gate is disposed between the second HDD regions.

8. The method of claim 1 further comprising forming a shallow trench isolation feature between the first device and the second device.

9. A method comprising:
   providing a substrate;
   forming a first transistor having an n-channel and a first gate including an n-type work function material, the first transistor being operable at a first voltage;
   forming a second transistor having an n-channel and a second gate including a p-type work function material, the second transistor being operable at a second voltage, the second voltage being higher than the first voltage;
   forming a third transistor having a p-channel and a third gate including a p-type work function material, the third transistor being operable at a third voltage;
   forming a fourth transistor having a p-channel and a fourth gate including an n-type work function material, the fourth transistor being operable at a fourth voltage, the fourth voltage being higher than the third voltage;
   performing a first implantation process to form source/drain regions for the first and second transistors; and
   performing a second implantation process to form source/drain regions for the third and fourth transistors.

10. The method of claim 9 wherein the performing the first implantation process to form the source/drain regions of the first and second transistors comprises utilizing a single mask to perform the first implantation process.

11. The method of claim 10 wherein the performing the first implantation process to form source/drain regions for the first and second transistors comprises forming lightly doped source/drain (LDD) regions for the first and second transistors.

12. The method of claim 9 wherein the performing the second implantation process to form the source/drain regions of the third and fourth transistors comprises utilizing a single mask to perform the second implantation process.

13. The method of claim 10 wherein the performing the second implantation process to form source/drain regions for the third and fourth transistors comprises forming lightly doped source/drain (LDD) regions for the third and fourth transistors.

14. The method of claim 9 wherein the forming the first transistor having the first gate including the n-type work function material and the forming the fourth transistor having the fourth gate including the n-type work function material comprises forming the first and fourth gate simultaneously.

15. The method of claim 9 wherein the forming the second transistor having the second gate including the p-type work function material and the forming the third transistor having the third gate including the p-type work function material comprises forming the second and third gate simultaneously.

16. An apparatus comprising:
   a substrate having a first region and a second region;
   a first field effect transistor (FET) disposed in the first region of the substrate, the first FET being operable at a first voltage, and the first FET including a first gate electrode of a first metal-containing material having a first-type work function;
   a second FET disposed in the second region of the substrate, the second FET being operable at a second voltage greater than the first voltage, and the second FET including a second gate electrode of a second metal-containing material having a second type work function that is opposite the first-type work function material;

wherein the first FET and the second FET are a same channel type.

17. The apparatus of claim 16 wherein the first and second FETs are n-channel FETs, the first metal-containing material being an n-type work function material, and the second metal-containing material being a p-type work function material.

18. The apparatus of claim 16 wherein the first and second FETs are p-channel FETs, the first metal-containing material being a p-type work function material, and the second metal-containing material being an n-type work function material.

19. The apparatus of claim 16 further comprising a shallow trench isolation feature disposed between the first FET and the second FET, such that the first and second FETs are isolated from one another.

20. The apparatus of claim 16 wherein the first FET has a first gate/channel length, and wherein the second FET has a second gate/channel length equal to the first gate/channel length.

\* \* \* \* \*